(12) United States Patent
Kim

(10) Patent No.: US 7,648,905 B2
(45) Date of Patent: Jan. 19, 2010

(54) FLASH MEMORY DEVICE AND A METHOD OF MANUFACTURING THE SAME

(75) Inventor: Sung-Jin Kim, Eumseong-gun (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/319,610

(22) Filed: Dec. 29, 2005

(65) Prior Publication Data

US 2007/0057319 A1     Mar. 15, 2007

(30) Foreign Application Priority Data

Sep. 15, 2005    (KR) .................. 10-2005-0086099

(51) Int. Cl.
*H01L 21/4763*    (2006.01)
*H01L 29/00*    (2006.01)

(52) U.S. Cl. .............. 438/622; 438/624; 438/637; 438/638; 257/499; 257/758; 257/E21.576; 257/E21.579; 257/E21.581

(58) Field of Classification Search ........... 438/618, 438/622, 624; 257/499, 758
See application file for complete search history.

(56) References Cited

U.S. PATENT DOCUMENTS

| | | | |
|---|---|---|---|
| 6,194,784 B1* | 2/2001 | Parat et al. ............... | 257/774 |
| 6,403,461 B1* | 6/2002 | Tae et al. ................. | 438/619 |
| 6,972,251 B2* | 12/2005 | Ning ....................... | 438/622 |
| 7,105,406 B2* | 9/2006 | Lutze et al. ............. | 438/257 |
| 2002/0027259 A1* | 3/2002 | Ikemasu et al. ......... | 257/499 |

* cited by examiner

*Primary Examiner*—Dao H Nguyen
(74) *Attorney, Agent, or Firm*—Lowe Hauptman Ham & Berner, LLP

(57) ABSTRACT

The present invention provides a flash memory device and a method of forming the same. The method includes: forming an isolation layer and a plurality of gate lines on a semiconductor substrate; forming a source/drain region by ion-implanting impurities into the semiconductor substrate using the gate lines as a mask; forming a side oxide layer on sidewalls and surfaces of the gate lines; forming a side nitride layer on the side oxide layer; forming an insulation layer on the semiconductor substrate and the side nitride layer; forming a photosensitive layer pattern on the insulation layer; exposing the source region between the gate lines by etching the insulation layer using the photosensitive layer pattern as a mask; forming a polysilicon layer on the exposed source region and the insulation layer; and forming a source line by etching the polysilicon layer.

6 Claims, 6 Drawing Sheets

FLASH MEMORY DEVICE AND A METHOD OF MANUFACTURING THE SAME

CROSS-REFERENCE TO RELATED APPLICATION

This application claims priority to and the benefit of Korean Patent Application No. 10-2005-0086099 filed in the Korean Intellectual Property Office on Sep. 15, 2005, the entire contents of which are incorporated herein by reference.

BACKGROUND OF THE INVENTION (a) Field of the Invention

The present invention relates to a flash memory device and a method of manufacturing the same.

(b) Description of the Related Art

Generally, a flash memory is devised to combine advantages of both EPROM (erasable programmable read only memory) and EEPROM (electrically erasable PROM), which provides a device enabling electrical data programming and erasing with a low manufacturing cost due to a simple manufacturing process and small chip size. Such a flash memory device is composed of a floating gate, a control gate, and a silicon substrate including an isolation layer, a tunnel oxide, and an insulation layer. In addition, program and erase operations are electrically performed.

Such a flash memory device includes a common source line for connecting a source of each cell. Such a common source is formed by performing an ion-implantation through a SAS (Self Aligned Source) process.

More particularly, the SAS process is performed by the following procedures. Firstly, a gate electrode is formed in a stacking structure including a field oxide layer and an isolation layer, and then a source region of a cell is opened by using an additional SAS mask. Subsequently, the field oxide layer and the isolation layer are removed by an anisotropic etching process so as to form a common source line.

Since a common source line in a flash memory cell using such a SAS process may be formed along a profile of a trench, and contact resistance of a source per cell may be significantly increased. The reason for the significant increase of resistance of the common source line is that since junction resistance is formed along a surface of a trench region, the actual surface resistance extends along the trench profile and the resistivity of the sidewall in the trench increases. That is, in performing the ion-implantation, since a relatively small amount of impurity is ion-implanted on sidewalls of the trench region, resistance of the common source line is significantly increased.

In addition, if an isolation layer is not completely removed, resistance of the common source line may be significantly increased because impurities may be non-uniformly implanted into the trench region.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a flash memory device and a method of manufacturing the same having advantages of minimizing the surface resistance of the common source line.

An exemplary flash memory device according to an embodiment of the present invention includes: a semiconductor substrate including a source region, a drain region, and an isolation layer; a plurality of gate lines formed on the semiconductor substrate; a side oxide layer formed on sidewalls and surfaces of the gate lines; a side nitride layer formed on the side oxide layer; and a source region formed between the gate lines, electrically connected to the source region.

The source line may be composed of polysilicon.

An exemplary method of manufacturing a flash memory device according to the present invention includes: forming an isolation layer and a plurality of gate lines on a semiconductor substrate; forming a source/drain region by ion-implanting impurities into the semiconductor substrate using the gate lines as a mask; forming a side oxide layer on sidewalls and surfaces of the gate lines; forming a side nitride layer on the side oxide layer; forming an insulation layer on the semiconductor substrate and the side nitride layer; forming a photosensitive layer pattern on the insulation layer; exposing the source region between the gate lines by etching the insulation layer using the photosensitive layer pattern as a mask; forming a polysilicon layer on the exposed source region and the insulation layer; and forming a source line by etching the polysilicon layer.

The insulation layer may be removed after forming the source line.

The forming of a plurality of gate lines may include: forming a first oxide layer on the semiconductor substrate; forming a first polysilicon layer on the first oxide layer; removing the first oxide layer by using the first polysilicon layer as a mask; forming a second oxide layer on the first polysilicon layer; and forming a second polysilicon layer on the second oxide layer and the isolation layer.

The etching of the polysilicon layer may be performed by a chemical mechanical polishing process or plasma etching process.

The source region may be formed between the isolation layers which are located between the gate lines.

The isolation layer may be formed in parallel with a bit line direction.

The source line may be formed in a straight line shape between the gate lines.

The gate line may be formed in parallel with the word line direction.

DETAILED DESCRIPTION OF THE EMBODIMENT

Figure 1:
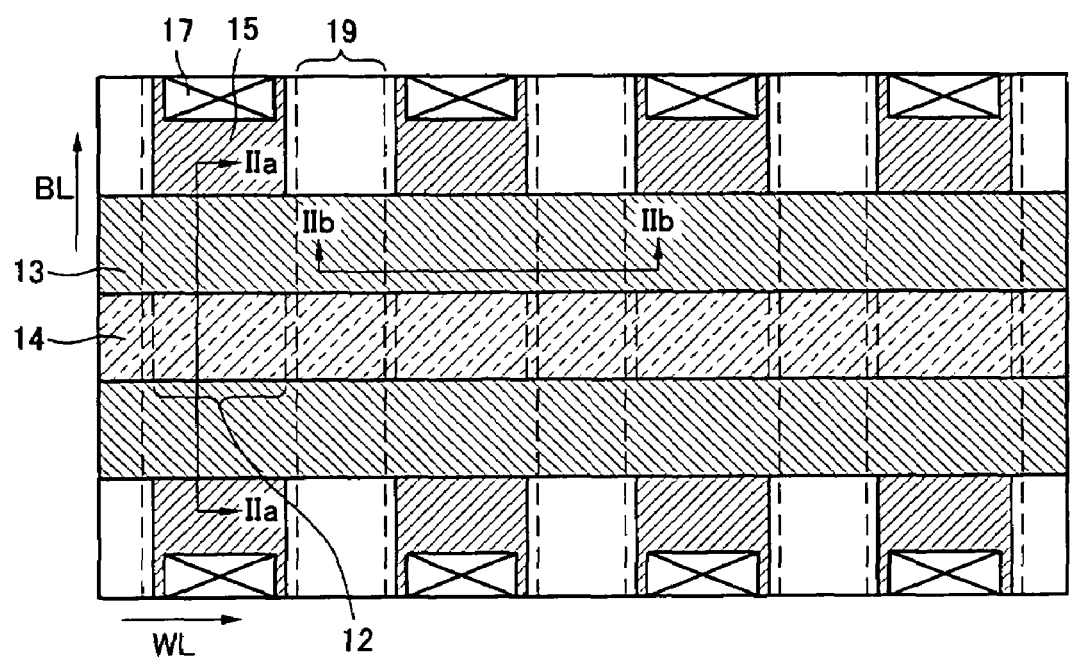
FIG. 1 is a top plan view showing a flash memory cell according to an exemplary embodiment of the present invention.

With reference to the accompanying drawings, the present invention will be described in order for those skilled in the art to be able to implement the invention. As those skilled in the art would realize, the described embodiment may be modified in various different ways, all without departing from the spirit or scope of the present invention.

To clarify multiple layers and regions, the thicknesses of the layers are enlarged in the drawings. Like reference numerals designate like elements throughout the specification.

When it is said that any part, such as a layer, film, area, or plate is positioned on another part, it means that the part is directly on the other part or above the other part with at least one intermediate part. On the other hand, if any part is said to be positioned directly on another part it means that there is no intermediate part between the two parts.

Hereinafter, a flash memory cell and a method of manufacturing the same according to an exemplary embodiment of the present invention are described in detail with reference to the accompanying drawings.

Figure 2A:
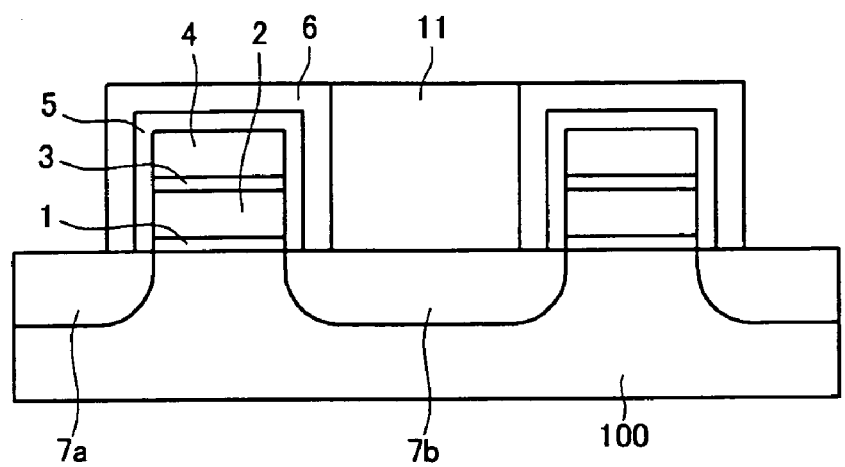
FIG. 2A and FIG. 2B are respectively cross-sectional views along lines IIa-IIa and IIb-IIb in FIG. 1.
Figure 2B:
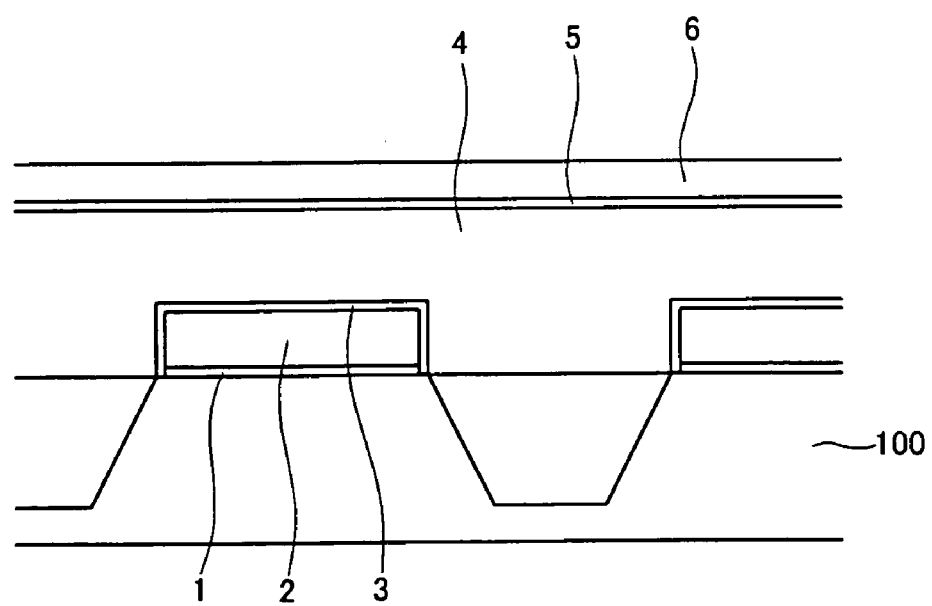

FIG. 1 is a top plan view for showing a flash memory cell according to an exemplary embodiment of the present invention, and FIG. 2A and FIG. 2B are respectively cross-sectional views along lines IIa-IIa and IIb-IIb in FIG. 1.

As shown in FIG. 1, FIG. 2A, and FIG. 2B a trench line 19 corresponding to a device isolation region including an isolation layer is formed on a semiconductor substrate 100, and a plurality of trench lines 19 are formed in parallel with a bit line direction. The dotted lines denote boundaries between slopes on the sidewalls of the trench lines 19.

In addition, a plurality of gate lines 13 are formed in the perpendicular direction to the trench lines 19, namely the parallel direction to the word lines. Source lines 14 are formed between the gate lines 13, and a dotted line on the source line 14 denotes a source region implanted by ion impurities. Here, the source line 14 is electrically connected to the source region 12.

In addition, a drain region 15 is formed in the opposite region to the source region with respect to the gate line 13, and a drain contact 17 is formed in the drain region 15.

As shown in FIG. 2A and FIG. 2B, a first oxide layer 1 is formed on a semiconductor substrate 100 including a source region 7b and drain region 7a, and a first polysilicon layer 2 is formed on the first oxide layer 1. Subsequently, a second oxide layer 3 is formed on the first polysilicon layer 2, and a second polysilicon layer 4 is formed on the second oxide layer 3. In addition, a side oxide layer 5 is formed on sidewalls of the first oxide layer 1, the first polysilicon layer 2, the second oxide layer 3, and the second polysilicon layer 4, as well as on the surface of the second polysilicon layer 4, and then a side nitride layer 6 is formed on the side oxide layer 5. In addition, a source line 11 electrically connected to the source region 7b is formed on the source region 7b between the gate lines (referring to 13 in FIG. 1).

Hereinafter, a method of manufacturing a flash cell according to an exemplary embodiment of the present invention will be described in detail with reference to the accompanying drawings.

FIG. 3A to FIG. 6B are cross-sectional views showing a method of forming a common source line of a flash memory cell according to an exemplary embodiment of the present invention.

Figure 3A:
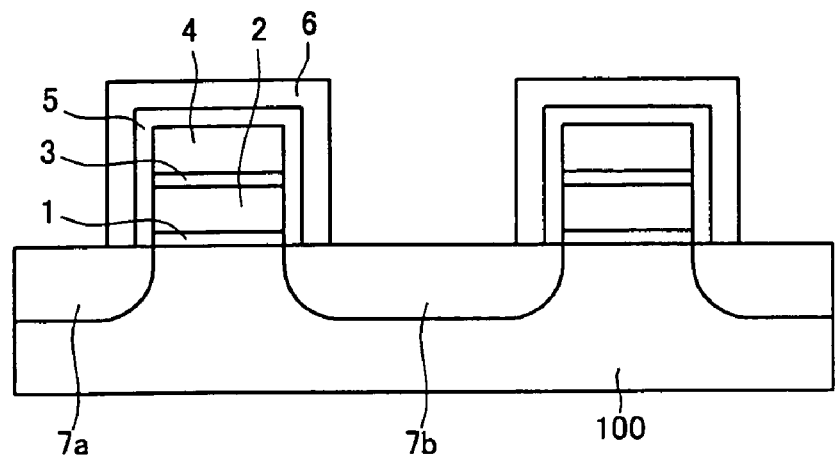
FIG. 3A to FIG. 6B are cross-sectional views showing a method of forming a common source line of a flash memory cell according to an exemplary embodiment of the present invention.
Figure 3B:
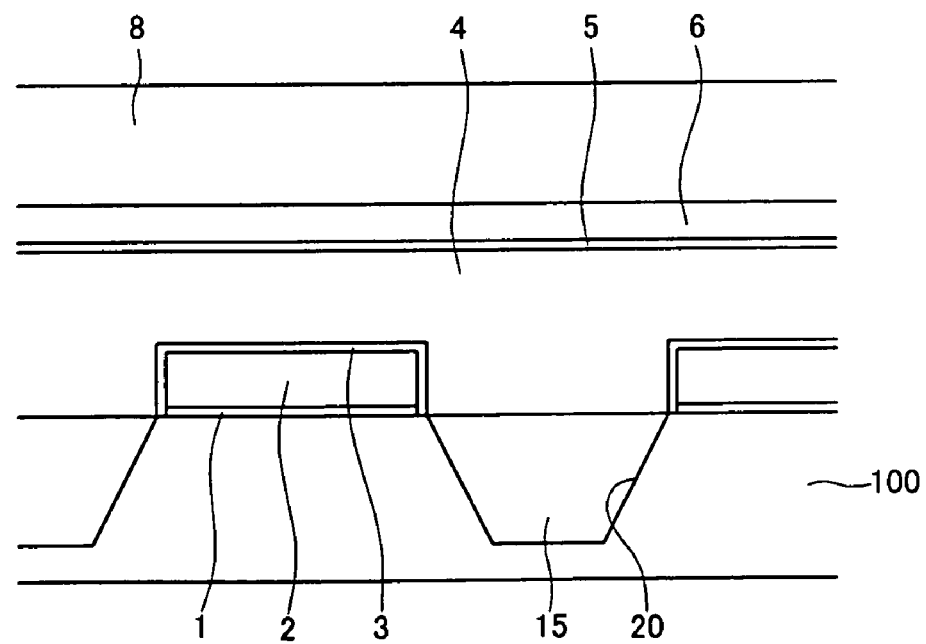

As shown in FIG. 3A and FIG. 3B, a trench 20 is formed by etching a semiconductor substrate 100, and an isolation layer 15 is formed by filling an insulating material into the trench 20. The trench 20 corresponds to a trench line 19 in FIG. 1. A plurality of trench lines 19 are formed in parallel with a bit line direction.

Subsequently, a first oxide layer 1 is formed on a portion of the semiconductor substrate 100 other than the trench 20, and then a first polysilicon layer 2 is formed on the first oxide layer 1. In addition, the first oxide layer 1 is removed by using the first polysilicon layer 2 as a mask.

Thereafter, a second oxide layer 3 is formed on the first polysilicon layer 2, and then a second polysilicon layer 4 is formed on the second oxide layer 3 and the isolation layer 15.

Accordingly, a plurality of gate lines (referring to 13 in FIG. 1) are formed in a perpendicular direction with respect to the trench line (referring to 19 in FIG. 1), namely in parallel with the word line direction. The first polysilicon layer 2 is formed between adjacent isolation layers 15, and then the second polysilicon layer 4 is formed on the first polysilicon layer 2 and the isolation layer 15.

Source and drain regions 7b and 7a are formed by ion-implanting impurities into the semiconductor substrate 100 using the gate lines 13 (refer to FIG. 1) as a mask. At this time, impurities are uniformly ion-implanted into the source and drain regions 7b and 7a. In addition, compared to the conventional source region formed along the surface of the trench region, the source region 7b has a smaller length of surface resistance.

Subsequently, a side oxide layer 5 is formed on the sidewalls of the first and second polysilicon layers 2 and 4 and on the surface of the second polysilicon layer 4, and then a side nitride layer 6 is formed on the side oxide layer 5.

Figure 4A:
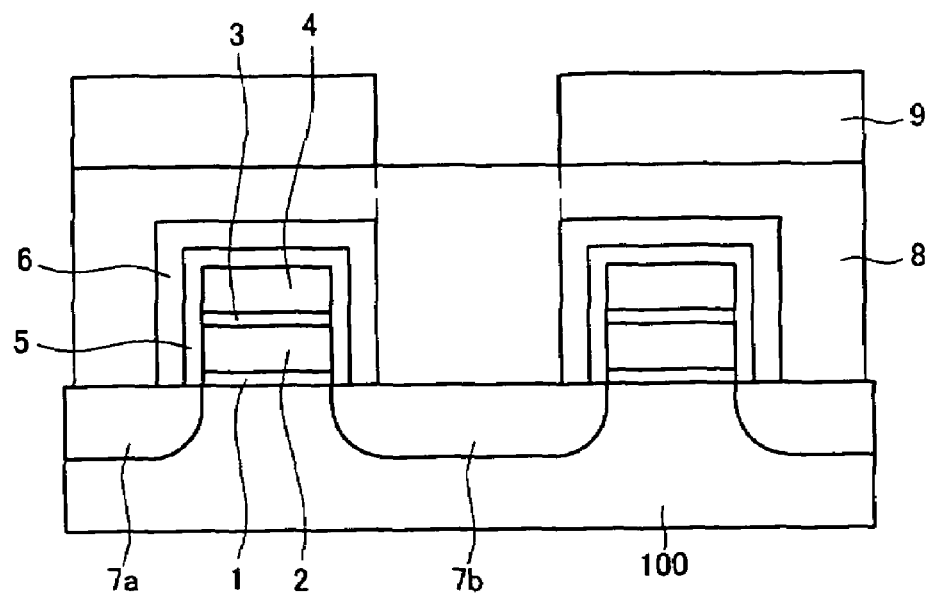
Figure 4B:
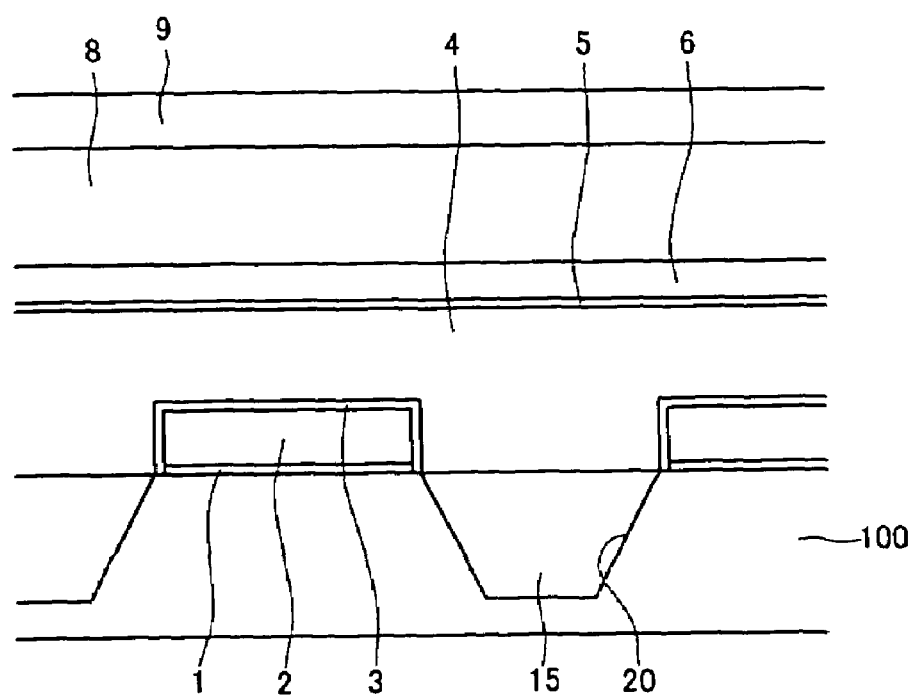

Thereafter, as shown in FIGS. 4A and 4B, an insulation layer that is a TEOS layer 8 is formed on the entire surface of the semiconductor substrate 100, and then a photosensitive layer 9 is formed on the TEOS layer 8. At this time, the photosensitive layer 9 is formed on portions of the TESO layer 8 other than the source region 7b.

Figure 5A:
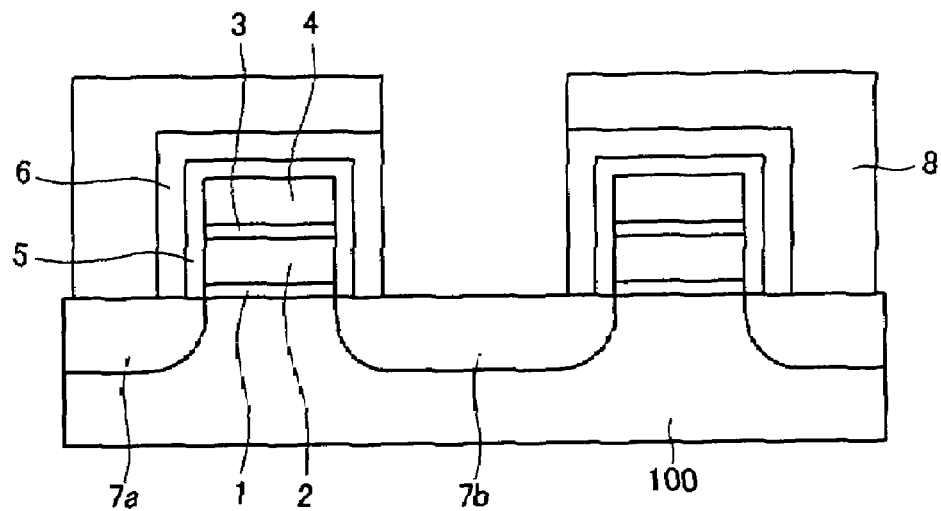
Figure 5B:
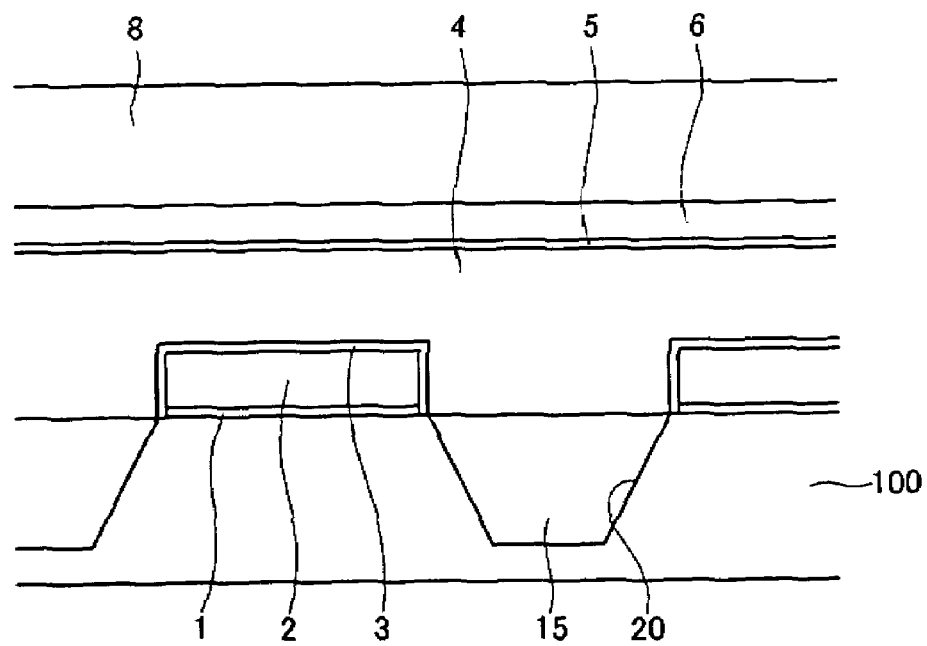

As shown in FIG. 5A and FIG. 5B, the source region 7b in the semiconductor substrate 100 is exposed by etching the TEOS layer 8 using the photosensitive layer 9 as a mask.

Figure 6A:
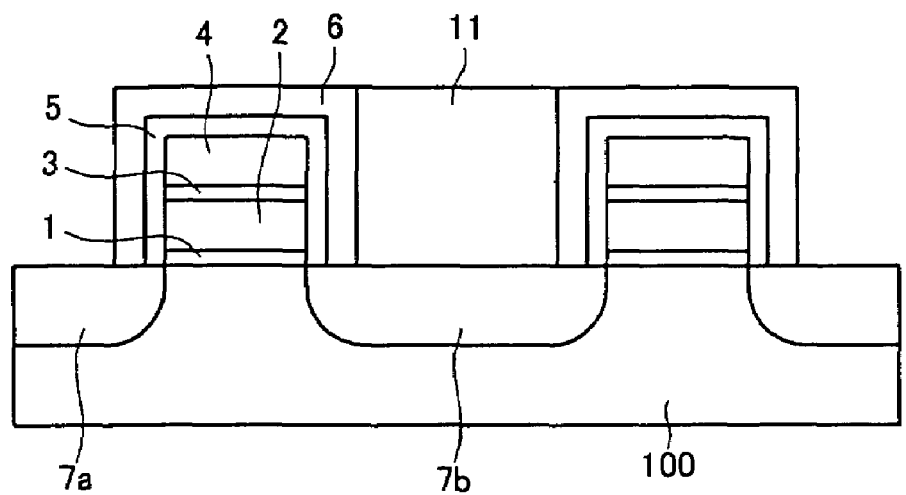
Figure 6B:
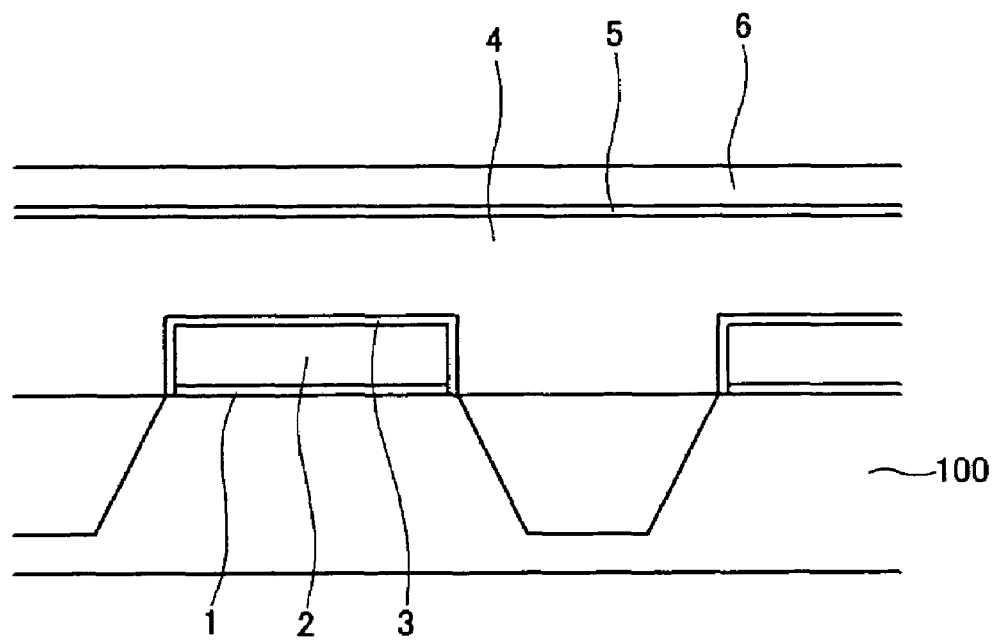

Subsequently, as shown in FIG. 6A and FIG. 6B, polysilicon is deposited on the exposed portion of the source region 7b and the TEOS layer 8, and then a source line 11 is formed by removing the polysilicon on the TEOS layer 8 through a CMP (chemical mechanical polishing) process and by removing the TEOS layer 8.

On the other hand, the source line 11 may be formed by a plasma etching process.

As described above, since the source region 7b uniformly implanted with ion impurities is formed in the region between the gate lines 13 (refer to FIG. 1), the source line 11 may have small surface resistance with respect to the source region 7b.

According to an exemplary embodiment of the present invention, a source region is formed by ion-implanting impurities without performing an additional process for removing an isolation layer, and a source line electrically connected to a source region is formed on the source region. The source line is formed in a straight line shape between the gate lines.

Therefore, a manufacturing process for a flash memory device can be simplified because the additional process for removing the isolation layer is not required.

In addition, resistance of a semiconductor device may be reduced because the surface resistance of a source line with respect to the source region is smaller than that of the conventional source line.

The present invention should not be considered as limited to the particular example described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the specification.

What is claimed is:

1. A method of manufacturing a flash memory device, comprising:

forming isolation layers and a plurality of gate lines on a semiconductor substrate;

forming source and drain regions by ion-implanting impurities into the semiconductor substrate using the gate lines as a mask;

forming a side oxide layer on sidewalls and surfaces of the gate lines;

forming a side nitride layer on the side oxide layer;

forming an insulation layer on the semiconductor substrate and the side nitride layer;

forming a photosensitive layer pattern on the insulation layer;

exposing the source regions between the gate lines by etching the insulation layer using the photosensitive layer pattern as a mask;

forming a polysilicon layer on the exposed source regions and the insulation layer; and forming a source line by etching the polysilicon layer so that the source line is laterally connected to the source regions;

wherein the insulation layer is removed after forming the source line; and wherein the etching of the polysilicon layer is performed by a chemical mechanical polishing process or plasma etching process.

2. The method of claim 1, wherein the forming of a plurality of gate lines comprises:

forming a first oxide layer on the semiconductor substrate;
forming a first polysilicon layer on the first oxide layer;
removing the first oxide layer by using the first polysilicon layer as a mask;
forming a second oxide layer on the first polysilicon layer; and
forming a second polysilicon layer on the second oxide layer and the isolation layer.

3. The method of claim 1, wherein the source region is formed between the isolation layers that are located between the gate lines.

4. The method of claim 1, wherein the isolation layer is formed in parallel with a bit line direction.

5. The method of claim 1, wherein the source line is formed in a straight line shape between the gate lines.

6. The method of claim 5, wherein the gate line is formed in parallel with the word line direction.

* * * * *